United States Patent [19]

Tanimoto et al.

[11] Patent Number: 5,019,781

[45] Date of Patent: May 28, 1991

[54] SOURCE LEVEL CONTROL FOR IMPEDANCE METER

[75] Inventors: Shigeru Tanimoto; Kouichi Takeuchi, both of Hachiojishi, Japan

[73] Assignee: Hewlett-Packard Company, Palo Alto, Calif.

[21] Appl. No.: 604,382

[22] Filed: Oct. 25, 1990

Related U.S. Application Data

[63] Continuation of Ser. No. 522,405, May 10, 1990, abandoned, which is a continuation of Ser. No. 302,849, Jan. 27, 1989, abandoned.

[30] Foreign Application Priority Data

Jan. 29, 1988 [JP] Japan .................................. 63-20955

[51] Int. Cl.[5] ............................................ G01R 27/28
[52] U.S. Cl. .................................... 324/649; 324/607; 324/608; 324/676; 324/710
[58] Field of Search ............... 324/649, 650, 605, 607, 324/608, 676, 677, 710, 705, 704, 713, 658, 691

[56] References Cited

U.S. PATENT DOCUMENTS

| | | | |
|---|---|---|---|
| 3,325,727 | 6/1967 | Haas | 324/60 C |
| 4,080,562 | 3/1978 | Rubel et al. | 324/57 R |
| 4,409,543 | 10/1983 | Sugihara | 324/57 R |
| 4,458,196 | 7/1984 | Goyal et al. | 324/57 R |
| 4,481,464 | 11/1984 | Noguchi et al. | 324/57 X |
| 4,728,881 | 3/1988 | Evans et al. | 324/62 X |

FOREIGN PATENT DOCUMENTS 2838257 3/1980 Fed. Rep. of Germany .... 324/57 R

OTHER PUBLICATIONS

Kameoka, "Measuring High-Value Capacitors", H.P. Journal, Mar. 1972, pp. 8–13.

*Primary Examiner*—Kenneth Wieder
*Assistant Examiner*—Robert W. Mueller

[57] ABSTRACT

An impedance meter with improved measurement accuracy obtained by controlling the level of the signal source. The impedance meter comprises a signal source, feedback amplifier, synchronous detector, A/D and control logic. The source level is maintaind by the control logic at a predetermined value by measuring the output of a synchronous detector and intermittently adjusting the level of the source thereby compensating for variations in test object's impedance. Control logic algorithms employed include successive substitution, bisection and linear interpolation.

5 Claims, 2 Drawing Sheets

FIG. 1

SOURCE LEVEL CONTROL FOR IMPEDANCE METER

FIELD OF THE INVENTION

The present invention relates to a measurement apparatus capable of measuring impedance or the like with high repeatability by keeping the measurement conditions as constant as possible.

DESCRIPTION OF THE PRIOR ART

Common impedance measurement apparatus of the prior art, such as schematically shown in FIG. 3, do not actively keep the AC level (of voltage or current) applied to the DUT (device under test) constant. In FIG. 3, because of the requirement of maintaining the stability of the measurement system, the signal source resistance $R_s$ cannot be reduced too excess, and thus it is usually determined at ten ohm or more. In the past, only an approximately constant voltage or current source was implemented by switching the signal source resistance $R_s$ according to the impedance of the DUT. In such a method, it was practically difficult to set the signal level applied to the DUT at a level desired by the user of the measurement apparatus.

SUMMARY OF THE INVENTION

An object of the present invention is to overcome the problems of the prior art depicted above, and to keep the AC level applied to the DUT constant without degradation of the stability of the measurement system.

In accordance with one embodiment of the present invention, there is provided an impedance measurement apparatus which keeps the AC current or voltage applied to the DUT at a constant level. This measurement apparatus provides at one end of the DUT an AC signal from a signal source, with the other end connected to a feedback circuit to force this end to be a virtual ground. The signals indicating the AC current and voltage fed to the DUT is extracted and subjected to synchronous detection (phase detection). The detection output is converted to a digital signal through a well-known dual slope ADC (analog-digital converter). The digital output signal is fed to a microcomputer, which in turn intermittently controls the signal source with referring to that digital signal so that the AC voltage or current applied to the DUT may get close to a predetermined value.

EMBODIMENT OF THE INVENTION

Figure 2:
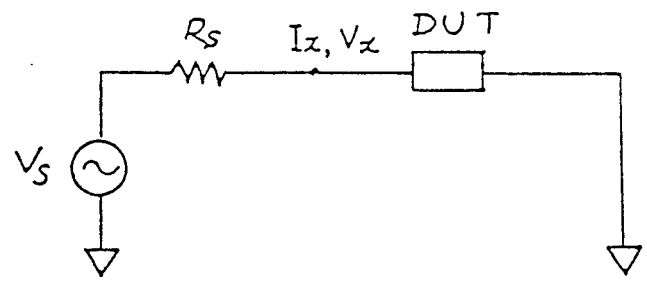
FIG. 2 is a diagram for explaining the principle of the present invention.
Figure 3:
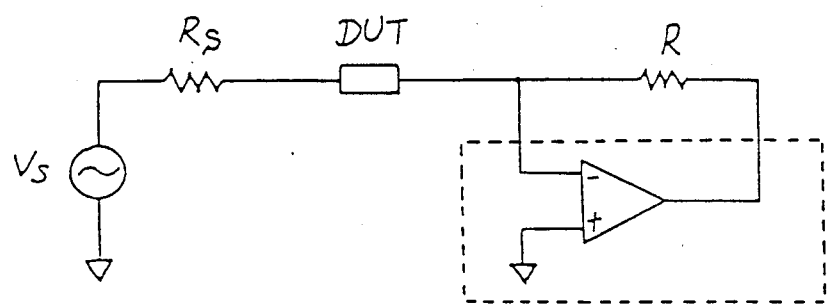
FIG. 3 is a diagram schematically showing one example of the measurement apparatus according to the prior art.

FIG. 2 is a diagram for explaining the principle of the present invention. In this figure, the following two equations hold:

$$I_x = V_s/Z \quad (1)$$

$$V_x = (Z_x/Z)*V_s \quad (2)$$

where $Z_x$ stands for the impedance of the DUT, Z for the overall impedance of the system, $V_s$ for the AC voltage of the signal source, $R_s$ for the internal resistance of the signal source, and $I_x$ and $V_x$ respectively for the current and voltage applied to the DUT. Because the impedance of the DUT is generally under the influence of the AC voltage $V_s$, $Z_x$ and Z are functions of $V_s$. Transforming the equation (1) by denoting $V_s$ as x, Z as f(x), and the target value of the current through the DUT as $I_{TGT}$ results in the equation below:

$$F(x) = x - I_{TGT}*f(x) = 0 \quad (3)$$

Similarly, denoting $V_s$ as x, $Z/Z_x$ as g(x), and the target of the voltage across the DUT as $V_{TGT}$, we obtain the equation below:

$$G(x) = x - V_{TGT}*g(x) = 0 \quad (4)$$

Thus, in order to make $I_x$ or $V_x$ coincide with the target value, the signal source may be controlled so that the AC voltage of the signal source may be set to the solution of $F(x)=0$ or $G(x)=0$, respectively. Because the functions F(x) and G(x) determined by the impedance of the DUT are different from DUT to DUT, and often have nonlinearity, it is impractical to analytically obtain the solutions of the above-mentioned equations. Hence, an operation is taken to successively approximate the solutions. The successive approximation methods which can be used includes the successive substitution, bisection algorithm and linear inverse interpolation, the detail of which will be described later.

Figure 1:
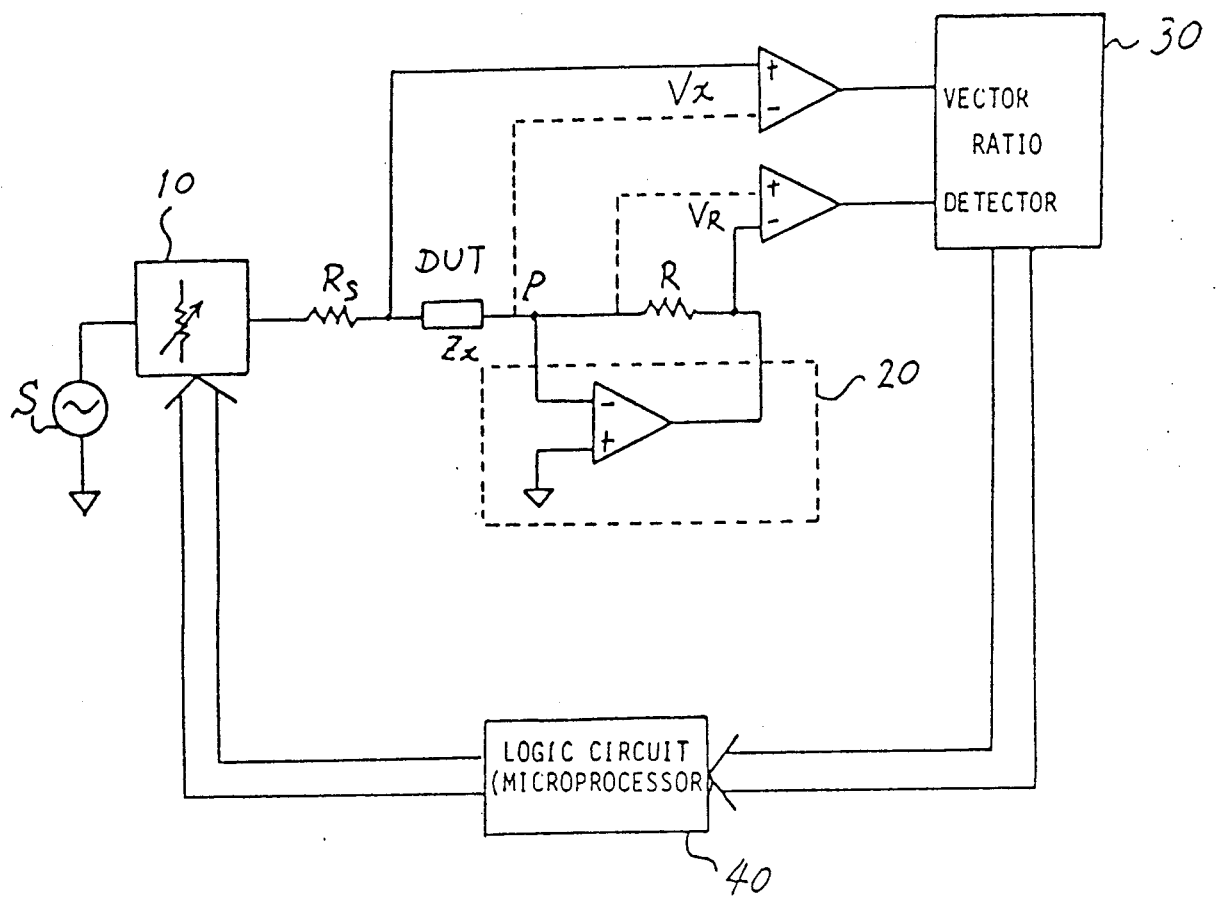
FIG. 1 is a block diagram showing a measurement apparatus according to one embodiment of the present invention.

FIG. 1 is a schematic diagram showing an impedance measurement apparatus according to one embodiment of the present invention.

In FIG. 1 the output of an AC signal source S is fed through a level control circuit 10 and a resistor $R_s$ to an device $Z_x$ to be measured (DUT). The other end of the DUT P is forced to be a virtual ground by the feedback circuit comprising a high gain amplifier 20 and a feedback registor R. The voltages $V_x$ and $V_R$ respectively across the DUT and the range register (feedback register) R ($V_R$ = (the current flowing through the DUT)*(-the resistance of the range resistor R)) are introduced into a vector ratio detector 30. (Because the point P is at the virtual ground, a substantially equal voltage is obtained by merely observing the potentials at the other ends of the DUT and the range registor R, as shown in FIG. 1.) Because the vector ratio detector 30 includes a phase detector and an dual slope type ADC, it can be used to determine the digital values of $V_x$ and $V_R$ (represented in a vector form) with the operations well-known to those skilled in the art. Thus, with the control over the operations of the vector voltage ratio detector 30 by a microprocessor in the logic circuit 40, the detector 30 is made to perform the digital conversion of the voltage $V_x$ in case the AC current of the DUT is to be controlled; the conversion of the voltage $V_R$ being required for controlling the AC voltage. Introducing the result of the digital conversion into the logic circuit 40 enables to calculate the new level control signal to the AC signal source, as was described above with reference to FIG. 2.

In this way, the logic circuit 40 acquires the digital data indicative of the AC voltage or current of the DUT, and computes and provides the AC signal source with a new level control signal value on the basis of the digital data for causing the AC voltage or current to approach a desired value. The repetitive calculation is quitted when this intermittent operation drives the AC voltage or current of the DUT within the range of allowable error relative to the desired value; then the required measurement is performed on the DUT.

In the embodiment, a multiplying-digital-to-analog converter can be used for the level control circuit 10. In addition, a warning indication may be asserted, when the logic circuit 40 detects the deviation out of the automatic adjust range.

The examples of the algorithms for determining the new control signal for the next cycle on the basis of the information about the AC voltage/current applied to the DUT will follow (Though the examples are shown in connection with the current, these algorithms apply to the case of the voltage).

Successive Substitution

The equation $$F(x) = x - I_{TGT}*f(x) = 0$$

gives the following:

$$x = I_{TGT}*f(x)$$

Then, starting from an appropriate first approximation $x_1$, repeat the following computation:

$$x_{k+1} = I_{TGT}*f(x_k)$$

Though not always converging, if it converges, the limit will be the solution. Let the true value of the solution be $x_T$ and the error of the k-th approximation $x_k - x_T$ be $e_k$. Then it is sufficient for the convergence that for any sufficiently large number k there exists a constant C whose absolute value is less than 1 such that the constant C satisfies the following condition:

$$|e_{k+1}| \leq C*|e_k|$$

Because this condition can be transformed to:

$$I_{TGT}*|f(x_k) - f(x_T)| \leq C*|x_k - x_T|$$

it is sufficient that the following condition holds over the neighborhood of $x_T$, after all:

$$I_{TGT}*|f'(x)| < 1$$

This algorithm need not any preparatory measurement for selecting a first approximation, as is opposed to the bisection algorithm described below. In addition, a single measurement provides the solution for a linear DUT (i.e., the DUT whose impedance is constant independent of the voltage or current thereof). For a nonlinear DUT, however, the repetition is not guaranteed to always converge. Thus, some DUTs require another algorithm.

Bisection Algorithm

Before starting the successive approximation, a preparatory measurement is conducted to locate two points, a and b, such that the following condition is satisfied:

$$F(a)*F(b) < 0$$

and F(c) is determined for $c = (a+b)/2$. In case F(a)*F(b) < 0, c will be employed as b for the next cycle; in case F(b)* F(c), c will be the next a. This procedure will be repeated until F(c) falls within a predetermined error range.

In the bisection algorithm, it is guaranteed that a convergence never fails to occur in a certain number of repetitions. On the other hand, however, it is necessary to perform a preparatory measurement for determining the first approximation for a and b. This preparatory measurement may be accomplished by, for example, sweeping the output of the AC signal source to observe the AC voltage (or current) of the DUT. Incidentally, this sweeping allows to find the range of the AC voltage (or current) that can be set for the DUT.

Linear Interpolation

As in the bisection algorithm, provide an interval [a, b] satisfying the condition:

$$F(a)*F(b) < 0$$

and perform the following procedure: (i) approximate F(x) by a straight line passing through two points, (a, F(a)) and (b, F(b)). Let the intersection of this straight line and the x-axis be c, and obtain F(c). c is represented as below:

$$c = (b*F(a) - a*F(b))/(F(a) - F(b))$$

(ii) If F(a)*F(c) < 0, then this c is employed as the new value of b for the next cycle. If F(b)*F(c) > 0, this c is employed as the new value of a for the next cycle. Repeat these steps, (i) and (ii), until F(c) falls within a predetermined error range.

The feature of this algorithm is substantially similar to that of the bisection algorithm, but the convergence is quicker if the DUT is approximately linear (if the DUT is completely linear, it converges in a single cycle). Depending upon the mode of the nonlinearity, however, the convergence can extremely slow. In this case, the following condition holds:

$$|F(a)/(a-x_T)| << F(b)/(b-x_T)|$$

(or, the condition with the inequality symbol reversed) where $x_T$ represents the solution.

On controlling the AC signal source with the aforementioned algorithms, the convergence can be guaranteed as well as made to be as quick as possible by selecting the appropriate algorithm for use based on the situation.

In case the user is not sure what level of the AC voltage (or current) can be set, the preparatory measurement is needed. In such a preparatory measurement, selection between, for example, the bisection algorithm and the linear inverse interpolation may be done based on the convergence rate. That is, in case the convergence of the linear inverse interpolation is slow, the bisection algorithm is to be used; otherwise, the linear inverse interpolation is to be used. The condition of slowing down the convergence involves the solution $x_T$ which is unknown before starting the successive approximation. Thus, the following criterion may be used instead:

Use the bisection algorithm, if $$|(F(a) - F(b))/(a-b)| \text{ is large, and}$$

$$|F(a)| >> |F(b)| (\text{or}, |F(b)| >> |F(a)|)$$

In such a case that the user can predict the range of the AC voltage (or current) to be set for the DUT, the AC signal source can be controlled without any preparatory measurement, for example, as described below:

Though the solution is basically determined on the basis of the successive substitution, because of the possibility of divergence, the following four possible cases are considered, with the minimum and maximum of the AC voltage that can be set denoted as $x_{min}$ and $x_{max}$ respectively:

(i) $I_{TGT}*f(x_T) > 1$
(ii) $0 < I_{TGT}*f(x_T) < 1$
(iii) $-1 \leq I_{TGT}*f(x_T) < 0$
(iv) $I_{TGT}*f(x_T) < -1$ The successive substitution diverges for the cases (i) and (iii). In this discussion, f(x) may be assumed as monotonous in the interval [$x_{min}$, $x_{max}$] for common DUTs. Thus, for the n-th approximated solution $x_n$, the following condition holds:

for the cases (i) and (ii) (i.e., $I_{TGT}*f(x_T) \geq 0$), $$F(x_n)*F(x_{n+1}) \geq 0$$

and for the cases (iii) and (iv) (i.e., $I_{TGT}*f(x_T) < 0$), $$F(x_n)*F(x_{n+1}) < 0$$

Then, at first apply the successive substitution with the first approximated solution determined as $x_1 = (x_{min} + x_{max})/2$ until $F(x_n)*F(x_{n+1}) < 0$ holds (where $x_i$ denotes the i-th approximated solution). Next, apply the procedure for the preparatory measurement to the interval [$x_n$, $x_{n+1}$] as described above. With this procedure, the convergence will be obtained for cases (ii) through (iv). For the case of divergence (i.e., case (i)), after obtaining $F(x_{min})$ and $F(x_{max})$, apply the procedure for the preparatory measurement as described above to the interval determined as below:

interval [$x_{min}$, $x_1$], if $F(x_1)*F(x_{min}) < 0$ interval [$x_1$, $x_{max}$], if $F(x_1)*F(x_{max}) < 0$ (Because f(x) is monotonous, either one of the above conditions holds.) Thus, the convergence is guaranteed for any monotonous f(x).

With the configuration and operation as above, the bias voltage or current will converge to a target value in two or three cycles of the operations of the digital loop for the common DUT such as L, C, R and diode; although the cycle count can change depending upon various factors such as the mode of the nonlinearity of the particular DUT and the algorithm employed for determining the control signal for the next cycle on the basis of the voltage/current information of the DUT. Therefore, the present invention enjoys a high utility.

EFFECTS OF THE INVENTION

As is described in detail heretofore, because the present invention enables the AC level of the voltage or current applied to the device under test to be kept constant, an improved repeatability of the measurement can be obtained even for the measurement of a device of nonlinearity. In addition, the intermittent feedback with the digital feedback loop for keeping the level constant prevents this feedback loop from interfering with the feedback loop for the measurement system itself, and thus does not degrade the analog stability of the measurement system.

What is claimed is:

1. A measurement apparatus for measuring a property of a device under test at a predetermined AC level, the device under test having first and second terminals, the measurement apparatus comprising:
   (a) a signal source means for applying an AC signal with a controllable AC level to the first terminal of the device under test;
   (b) feedback circuit means, connected to the second terminal of the device under test, for forcing the second terminal of the device under test to be virtually grounded;
   (c) synchronous detector means, connected to the first terminal of said device under test and to the feedback circuit means, for obtaining measurement signals representing current and voltage of the device under test, and for performing synchronous detection of the measurement signals;
   (d) analog-digital converter means, connected to the synchronous detector means, for performing analog-digital conversion by integrating an output of the synchronous detector means; and
   (e) digital logic means, connected to the analog-digital converter means and responsive to an output of the analog-digital converter means, for intermittently controlling the AC level of the signal source means, whereby the AC level applied to the device under test is maintained at the predetermined AC level.

2. The measurement apparatus of claim 1, wherein the digital logic means accomplishes the intermittent controlling using an approximation algorithm such that the controllable AC level converges to the predetermined AC level.

3. The measurement apparatus of claim 2, wherein the approximation algorithm is selected from a set consisting of successive substitution, bisection and linear interpolation.

4. The measurement apparatus of claim 1, wherein the predetermined AC level is a predetermined current flowing through the device under test.

5. The measurement apparatus of claim 1, wherein the predetermined AC level is a predetermined voltage across the device under test.

* * * * *